(12) United States Patent
McCarthy et al.

(10) Patent No.: US 7,583,945 B2
(45) Date of Patent: Sep. 1, 2009

(54) AMPLIFIER WITH IMPROVED NOISE PERFORMANCE AND EXTENDED GAIN CONTROL RANGE

(75) Inventors: Daniel P. McCarthy, Elk Grove Village, IL (US); Lawrence E. Connell, Naperville, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 662 days.

(21) Appl. No.: 11/329,752

(22) Filed: Jan. 10, 2006

(65) Prior Publication Data

US 2007/0161359 A1    Jul. 12, 2007

(51) Int. Cl.
 *H04B 1/06* (2006.01)
(52) U.S. Cl. .................................... 455/249.1; 455/254
(58) Field of Classification Search .............. 455/234.1, 455/234.2, 239.1, 240.1, 241.1, 245.1, 249.1, 455/250.1, 254; 330/282, 284
See application file for complete search history.

(56) References Cited

U.S. PATENT DOCUMENTS

| 4,665,560 | A  | * | 5/1987  | Lange  | ............ 455/249.1 |
| 4,839,611 | A  | * | 6/1989  | Kukulinsky | ............ 330/284 |
| 6,978,117 | B2 | * | 12/2005 | Zerod et al. | ............ 455/249.1 |
| 2005/0012553 | A1 |  | 1/2005 | Mondal et al. | |

OTHER PUBLICATIONS

U.S. Appl. No. 11/238,657, filed Sep. 28, 2005.

* cited by examiner

*Primary Examiner*—Thanh C Le
(74) *Attorney, Agent, or Firm*—Brinks, Hofer, Gilson & Lione (57) ABSTRACT

An amplifier and method of amplifying a signal is presented. The amplifier contains a fixed gain stage, a digitally controllable gain stage, and a continuously variable attenuator connected between the fixed and controllable gain stages. The attenuator and controllable gain stage are controllable such that the gain of the controllable gain stage is decreased when the attenuation of the attenuator reaches a predetermined maximum value and the attenuation of the attenuator is reduced thereafter. The output power level of the amplifier remains constant.

23 Claims, 10 Drawing Sheets

Figure 7 – Attenuation(dB) vs Control Voltage for Single Mosfet and Three Mosfet Attenuators

AMPLIFIER WITH IMPROVED NOISE PERFORMANCE AND EXTENDED GAIN CONTROL RANGE

TECHNICAL FIELD

The present application relates to an amplifier. More specifically, the present application relates to an amplifier having a variable attenuator having a linear gain slope and a controllable gain stage.

BACKGROUND

Televisions contain a number of components, including a screen such as a cathode ray tube (CRT), liquid crystal display (LCD) or plasma display, as well as circuitry to receive a signal to be displayed and display the signal on the screen. This circuitry includes a tuner that tunes to a particular carrier (frequency) to receive the desired signal.

Television tuners receive carriers over a predetermined range, e.g. from 50 MHz to over 860 MHz for some standards. This is a relatively wide range of frequencies compared to other electronic devices, such as cellular telephones, which operate over a frequency range of 100 MHz or so. The incoming signal power to a tuner can vary by many orders of magnitude depending on a variety of factors such as distance of the tuner to the signal source or the environmental conditions, for example. Moreover, the signal strength may vary continuously, if the television is mobile, as the television is being transported.

However, the change in signal strength is problematic. Before the signal is provided to an output of the tuner, it is amplified by a gain stage having a constant (fixed) gain. In this case, the signal strength provided to the gain stage is adjusted so that the signal is within the range of the gain stage. That is, if the amplitude of the signal is too large, the gain stage will distort the peaks of the signal and thus degrade the output of the tuner. Accordingly, there exists a need to continuously control the gain of the tuner over a wide range of input analog voltages such that a constant output power level is achieved.

To control the gain of the tuner, an amplifier containing the gain stage and a variable attenuator is provided. The attenuator is disposed between the input of the amplifier and the gain stage. It is desirable to have a continuous gain control of the attenuator using an analog control voltage. However, providing variability adds complexity and distortion problems. For example, a tradeoff exists between the sensitivity of the attenuation control voltage and the attenuation range.

In addition, altering the gain of the tuner changes the noise figure of the tuner. The noise figure is the ratio of the total output noise power to the output noise due to a standard input source resistance, e.g. a 50 ohm resistance. In particular, the noise figure of an amplifier having a fixed output level degrades with decreasing gain (i.e. for larger input levels). The noise of the tuner increases when the noise figure reaches a particular value dependent on the configuration of the tuner, primarily as the noise contribution of the gain stage becomes significant.

DETAILED DESCRIPTION OF THE EMBODIMENTS

An amplifier with a linear variable attenuator and controllable gain stage is provided. The attenuator is continuously variable using an analog control signal, and the gain stage is digitally controllable such that the gain of the gain stage is changed in discrete steps. The amplifier is disposed in a tuner or other electronic device. The tuner combines a continuously variable gain amplifier with a digitally variable gain amplifier to provide improved noise performance over an extended gain control range. The attenuator may have a constant attenuation slope, low intermodulation distortion, and/or be easily implemented. This may enable integration of an automatic gain control amplifier into the tuner, which reduces cost and increases flexibility in design of the tuner.

Figure 1:
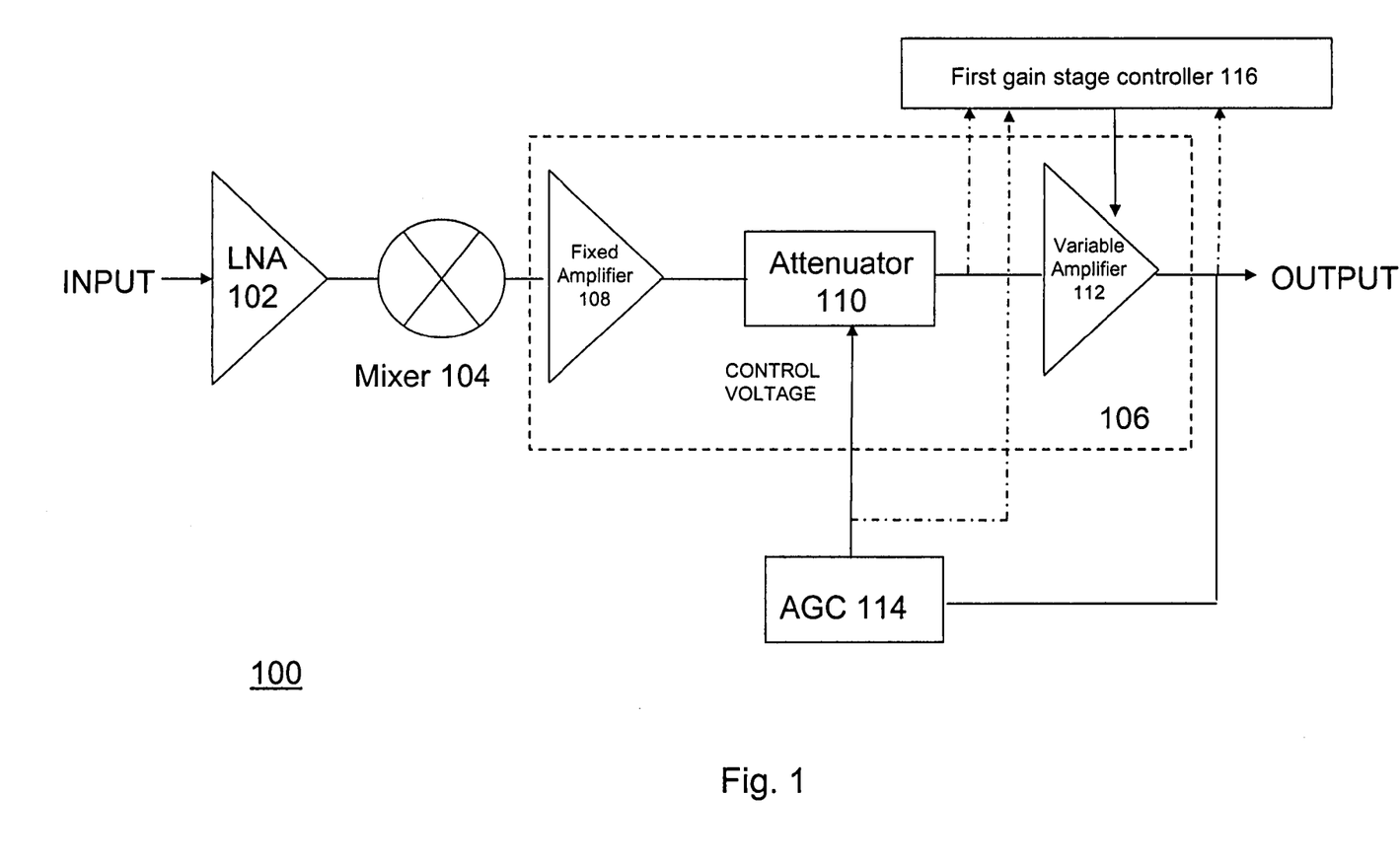
FIG. 1 is a block diagram of circuitry in a tuner in accordance with an embodiment of the invention.

FIG. 1 illustrates a block diagram of a tuner in accordance with an embodiment. Although other elements may be present, such as an analog-to-digital (A/D) converter or coupling capacitors, such circuitry is not shown for clarity. As illustrated, the tuner 100 contains a low noise gain stage (LNA) 102 having an input connected to the input of the tuner 100. An input of a mixer 104 is connected to an output of the LNA 102. An output of the mixer 104 is connected to an input of an amplifier 106.

The amplifier 106 includes one or more input gain stages 108, one or more attenuators 110, and one or more output gain stages 112. For clarity, only one input gain stage, attenuator, and output gain stage is illustrated in FIG. 1. The input gain stage 108 (hereinafter referred to as fixed gain stage 108) has a fixed gain, the attenuator 110 (hereinafter referred to as variable attenuator 110) provides a variable attenuation, and the output gain stage 112 (hereinafter referred to as controllable gain stage 112) has a controllable gain. The fixed gain stage 108 and controllable gain stage 112 may contain CMOS (complementary metal-oxide semiconductor) circuitry, bipolar circuitry, and/or BiCMOS (BipolarCMOS—a type of integrated circuit that uses both bipolar and CMOS technologies). An output of the fixed gain stage 108 is connected to an input of the variable attenuator 110. An input of the controllable gain stage 112 is connected to an output of the variable attenuator 110. An output of the controllable gain stage 112 is connected to an input of an automatic gain controller (AGC) 114, whose output is connected to a control terminal of the variable attenuator 110. The output of the controllable gain stage 112 is also supplied as an output of the tuner 100. A first gain stage controller 116 is connected to a control terminal of the controllable gain stage 112. In the embodiment shown, the output of the AGC 114 may be supplied to the first gain stage controller 116. Although not shown, one or more controllable gain stages can additionally be disposed in the amplifier between the input of the amplifier 106 and the variable attenuator 110 and/or one or more fixed gain stages can additionally be disposed between the variable attenuator 110 and the output of the amplifier 106.

A signal of a predetermined frequency range (e.g. from 50 MHz to 860 MHz) is supplied to the LNA 102 through the input of the tuner 100. The signal is linearly amplified by the LNA 102 before being passed to the mixer 104. The mixer 104 down-converts the linearly amplified signal to baseband (0 Hz) or near baseband before supplying the down-converted signal to the first gain stage 108. The fixed gain stage 108 amplifies the down-converted signal by a predetermined amount and then supplies the amplified signal to the variable attenuator 110. The variable attenuator 110 attenuates the amplified signal. The attenuated signal is then amplified by another selectable amount in the controllable gain stage 112. In the AGC loop, the AGC 114 receives a feedback signal of the amplified signal from the controllable gain stage 112 and uses the feedback signal to adjust the control voltage, and thus, the amount of attenuation.

Figure 2:
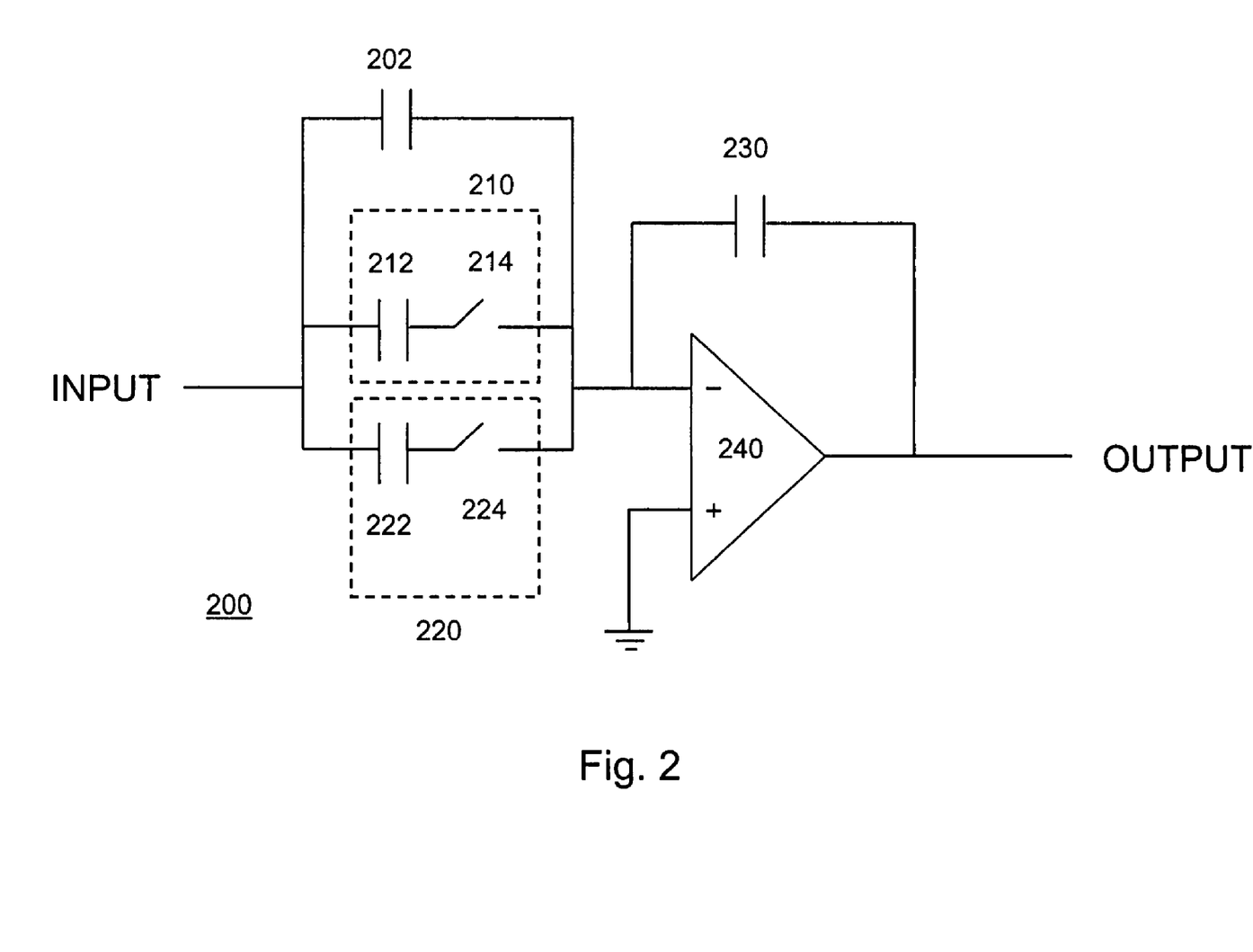
FIG. 2 shows one embodiment of the first gain stage of FIG. 1.

One embodiment of the controllable gain stage is shown in FIG. 2. The controllable gain stage 200 includes an operational amplifier (op-amp) 240 having a non-inverting input terminal, an output terminal, and an inverting input terminal. The non-inverting input terminal of the op-amp 240 is grounded. The output terminal of the op-amp 240 is connected to the inverting input terminal through a feedback circuit 230. The feedback circuit 230 includes a feedback capacitor. The inverting input terminal of the op-amp 240 is connected to the input of the controllable gain stage 200 through a fixed input capacitor 202 and a plurality of circuits 210, 220. The first circuit 210 contains a first capacitance 212 and first switch 214 connected in series. The second circuit 220 contains a first capacitance 222 and first switch 224 connected in series. The first and second circuits 210, 220 are connected in parallel. The first and second switches 214, 224 are connected to the first gain stage controller 116 (not shown in FIG. 2). The first gain stage controller 116 closes one or both of the first and second switches 214, 224 to adjust the gain of controllable gain stage 200 in discrete steps.

Although only two circuits 210, 220 are shown in FIG. 2, three or more circuits may be connected between the inverting input terminal of the op-amp 240 and the input of the controllable gain stage 200. These circuits may be identical or different. For example, the capacitances may be the same or different and may be disposed in the same configuration between the circuits or in a different configuration. Alternatively, more electrical elements may be used in one or more of the circuits. All the circuits may be controlled by the first gain stage controller 116. In addition, other elements may be present in the feedback circuit 230, such as a feedback resistor in parallel with the feedback capacitor to provide DC feedback between the output and the inverting input terminal of the op-amp 240.

The fixed input gain stage 108 provides a constant input impedance and a good noise figure. The variable attenuator 110 is controlled by a continuous analog voltage supplied by the AGC 114. The controllable gain stage 112, on the other hand, is varied digitally by the first gain stage controller 116. Thus, the gain of the controllable gain stage 112 can be set in discrete steps. Since the output level of the amplifier 106 is fixed, the gain of the controllable gain stage 112 determines the maximum signal level across the variable attenuator 110. The variable attenuator 110 is less linear the larger the signal level across the variable attenuator 110. The amount of attenuation in the variable attenuator 110 also determines the amount of gain in the controllable gain stage 112, as shown in the operational block diagram of FIG. 3.

Figure 3:
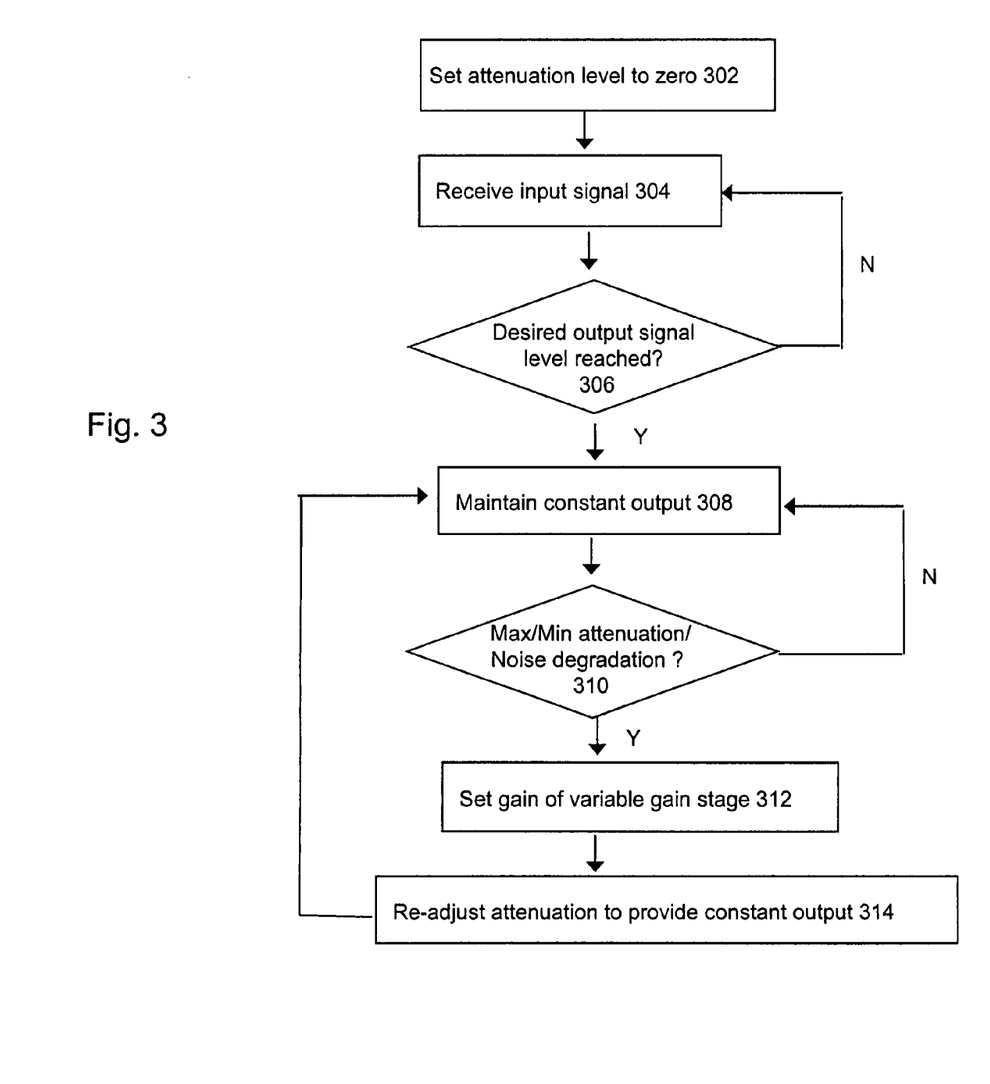
FIG. 3 is a block diagram showing operation of the amplifier in FIG. 1 in accordance with an embodiment of the invention.

In FIG. 3, when no input signal is received, the variable attenuator 110 is off (block 302), i.e. the attenuation is zero. Thus, the amplifier 106 provides maximum gain. As an input signal is initially received by the amplifier 106 (block 304) and the input signal level increases, the output signal level of the amplifier 106 increases until it reaches a desired level (block 306). At this point the variable attenuator 110 is turned on and attenuates the intermediate signal such that the output power level stays constant (block 308).

More specifically, if the output of the tuner 100 is within a predetermined voltage from the maximum output voltage or if some other criterion is reached, the AGC 114 controls the variable attenuator 110 to increase the amount of attenuation. Thus, as the input signal level continues to increase, the variable attenuator 110 continues to increase the attenuation until it reaches maximum attenuation or the noise figure of the amplifier 106 becomes degraded (block 310). At this point, the gain of the controllable gain stage 112 can be set to a lower level (block 312) and less attenuation is provided from the variable attenuator 110 (block 314). The noise figure improves because of the decrease in attenuation of the variable attenuator 110.

As shown in FIG. 1, the gain of the controllable gain stage 112 is set by the controller 116. The controller 116 monitors the output of the AGC 114, the output of the variable attenuator 110, and/or the output of the amplifier 106. The controller 116 adjusts the gain of the controllable gain stage 112 to maintain the constant output power level from the amplifier 106 when the variable attenuator 110 has reached either a minimum or maximum limit or the noise figure becomes degraded. The first gain stage controller 116 may contain a microprocessor or other suitable circuit capable of adjusting the gain of the controllable gain stage 112 based on a signal from the AGC 114, the variable attenuator 110, and/or the controllable gain stage 112. Although in FIG. 1, the AGC 114 and the first gain stage controller 116 are shown as separate elements, they may be combined in the same control circuit, such as the same microprocessor for example.

As the input signal level increases even further, the variable attenuator 110 continues to maintain a constant output power level (block 308) by once again increasing attenuation of the input signal. When the noise figure again becomes degraded (block 310), the controllable gain stage 112 can be digitally set to a new lower gain level (block 312), and the attenuation is readjusted to provide a constant output power level (block 314). This process is repeated as desired.

Similarly, if the output of the tuner 100 is within a predetermined voltage from the minimum output voltage or a different criterion is reached, the AGC 114 controls the variable attenuator 110 to decrease the amount of attenuation. Thus, as the input signal level continues to decrease, the attenuation provided by the variable attenuator 110 continues to decrease until a minimum attenuation (block 310) is reached. At this point, the gain of the controllable gain stage 112 can be set to a higher level (block 312) and a greater amount of attenuation is provided by the variable attenuator 110 (block 314).

The first gain stage controller 116 may initially set the gain of the controllable gain stage 112 to the minimum gain of the controllable gain stage 112, to the maximum gain of the controllable gain stage 112, or somewhere in between the minimum and maximum gains of the controllable gain stage 112. When the attenuation of the attenuator 110 increases, the noise figure increases due to the increase in attenuation. However, by adjusting the gain of the controllable gain stage 112, the attenuation of the attenuator 110 is correspondingly adjusted and the overall range of gain over which an acceptable noise figure may be achieved is extended. Thus, a variable gain control with an acceptable noise figure can be achieved over a relatively large AGC range.

Figure 4:
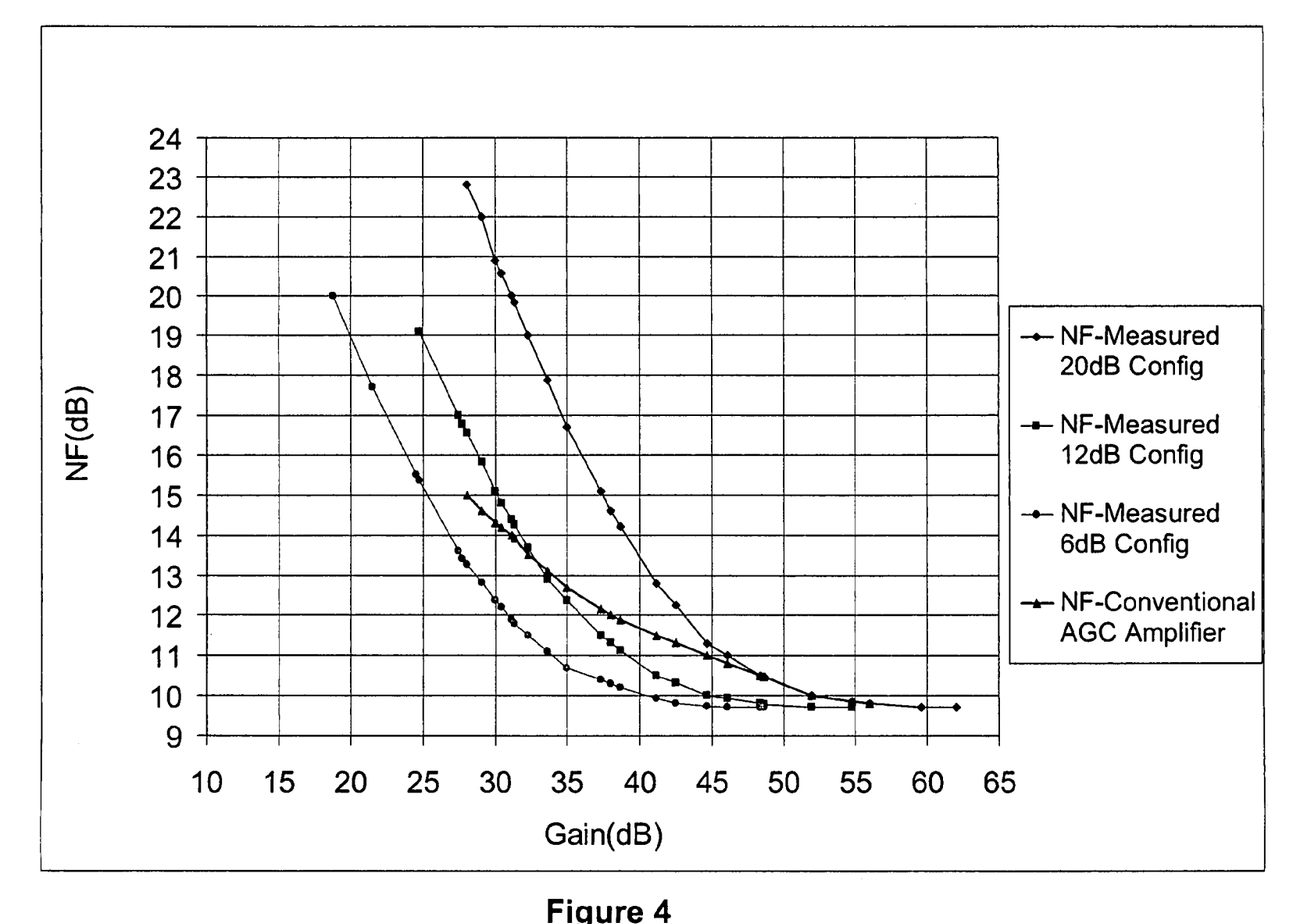
FIG. 4 is a plot of noise figure vs. gain and compares a conventional automatic gain control (AGC) amplifier with an embodiment of the invention.

The plot of FIG. 4 illustrates one example of amplifier noise figure vs. gain given a constant output power level for the amplifier 106 shown in FIG. 1 compared with a conventional AGC amplifier. For a desired noise figure of about 15 dB or less, as shown, the gain for the conventional AGC amplifier ranges between about 28 dB to 56 dB, which is only about 28 dB. By adjusting both the attenuation of the variable attenuator 110 and the gain of the controllable gain stage 112, a gain range of about 25 dB to 62 dB (i.e. a range of about 37 dB) can be obtained for the same noise figure. In the plot, the gain of the controllable gain stage 112 starts at about 20 dB as a small input signal is provided to the amplifier 106. As the input signal level increases, the attenuation of the variable attenuator 110 increases until the gain of the amplifier 106 reaches about 37 dB. At this point, the noise figure reaches about 15 dB, the gain of the controllable gain stage 112 is reduced to about 12 dB and the attenuation of the variable attenuator 110 is reduced, thereby reducing the noise figure. As the input signal level continues to increase, the attenuation of the variable attenuator 110 increases until the gain of the amplifier 106 reaches about 30 dB. At this point, the noise figure again reaches about 15 dB, the gain of the controllable gain stage 112 is reduced to about 6 dB and the attenuation of the variable attenuator 110 is reduced, thereby once more reducing the noise figure until a gain of about 25 dB is reached. Alternatively, if the minimum noise figure is desired, the gain of the controllable gain stage 112 and the attenuation of the variable attenuator 110 may be altered at about 55 dB and again at about 48 dB rather than at 37 dB and 30 dB, respectively.

Although only three gain levels (20 dB, 12 dB, 6 dB) are shown, the changes in the gain of the controllable gain stage may be provided in other steps. In addition, dependent on the amplifier or tuner design, the range of gain of the controllable gain stage may extend below 6 dB or above 20 dB. Examples, of design choices include the amount of permissible intermodulation distortion or the linearity desired (discussed in more detail below).

Figure 5:
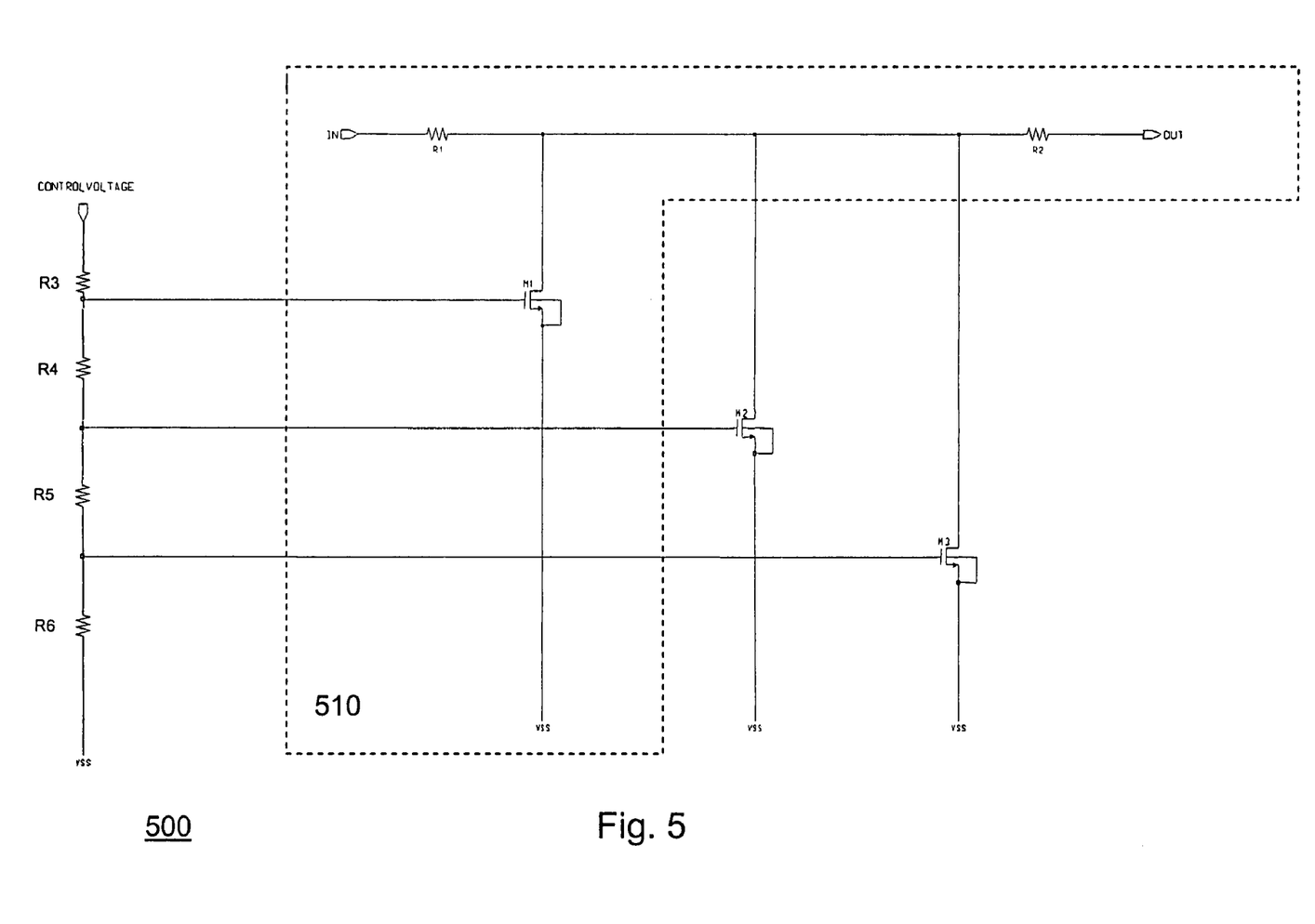
FIG. 5 illustrates an embodiment of the variable attenuator in accordance with an embodiment of the invention.
Figure 6:
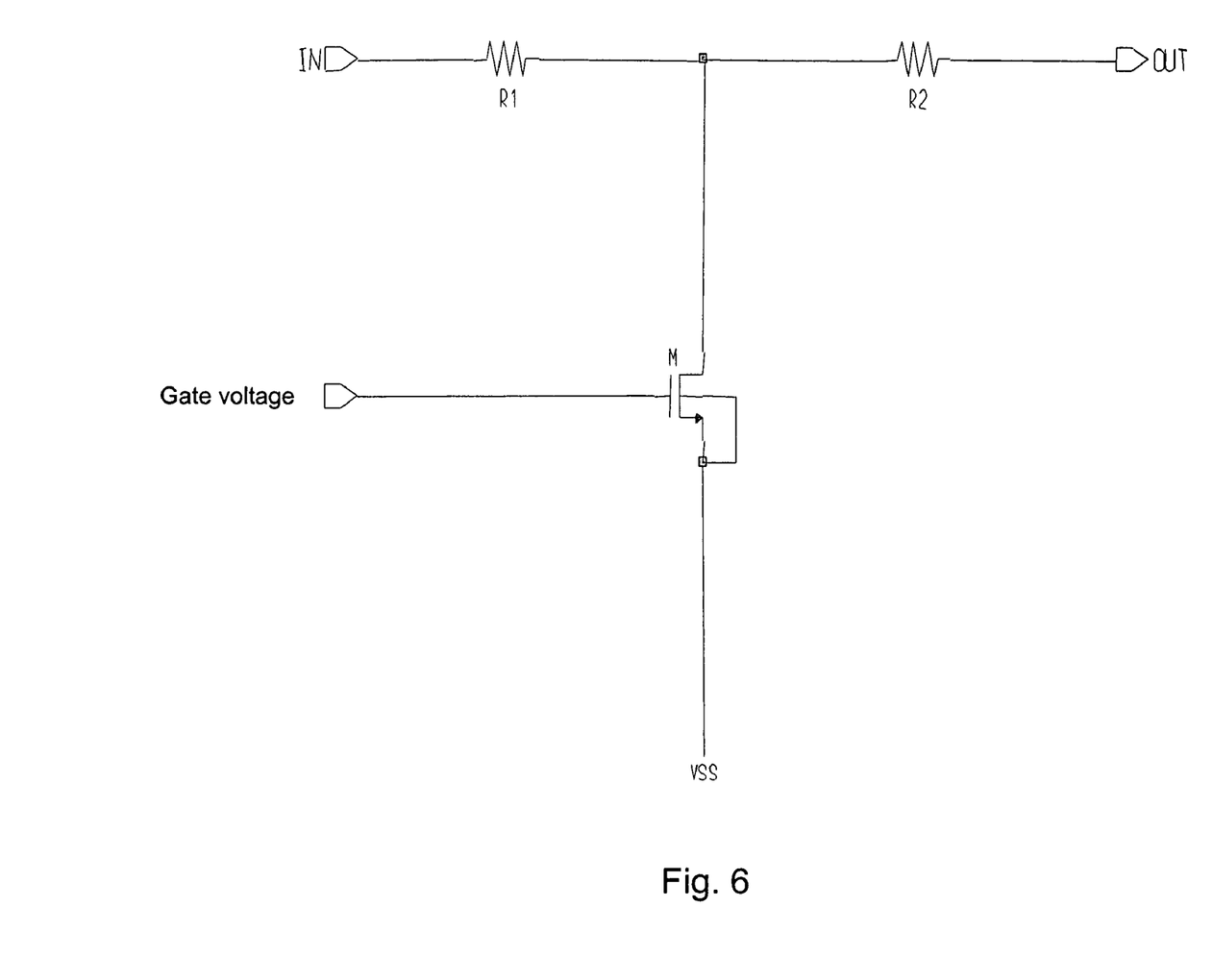
FIG. 6 is an enlargement of the input section of the tuner in FIG. 5.

Turning to the attenuator 110, FIG. 5 illustrates a variable attenuator 500 and FIG. 6 is an enlargement showing input section 510 in FIG. 5. As shown, the variable attenuator 510 contains a pair of first elements (shown and hereinafter described as resistors R1, R2) and a single second element (shown and hereinafter described as MOSFET M). The resistors R1, R2 are connected in series between the input IN and the output OUT of the variable attenuator 510. The shunt MOSFET M is connected between a node between the resistors R1, R2 and ground Vss. The substrate of the MOSFET M is grounded. A control voltage is connected to the control terminal (gate) of the MOSFET M. The MOSFET M acts as a shunt resistor, having a large resistance when off (i.e. when the channel between the source and drain regions is closed) and having a substantially smaller resistance when on (i.e. when the channel is open). For example, when the MOSFET M is off, the resistance may be 10R1, while when the MOSFET M is on, the resistance may be 0.1R1. Thus, when the MOSFET M is off, the voltage at the node between the resistors R1, R2 is maximized and when the MOSFET M is on, the voltage at the node is minimized. Accordingly, the attenuation varies from a relatively small amount when the MOSFET M is off to a relatively large value when the MOSFET M is on.

However, while the control voltage is able to vary the attenuation of the variable attenuator of FIG. 6, the slope of the attenuation curve is linear over only a small range. As the MOSFET turns on, the slope of the attenuation curve starts to increase. As the control voltage increases further, this slope reaches a maximum. Unfortunately, the slope does not stay constant as the control voltage keeps increasing. At a certain control voltage, the slope magnitude of the attenuation versus the control voltage curve begins to decrease. This can be seen as the drain-to-source resistance Rds of the MOSFET is given by (1).

$$R_{ds} = \frac{L}{\mu C_{ox} W (V_{gs} - V_T)} \quad (1)$$

In this equation, L is the length of the channel, μ is the mobility of the carriers, $C_{ox}$ is the capacitance formed across the oxide, W is the channel width, Vgs is the gate-to-source voltage, and Vt is the threshold voltage. Equation (1) shows that the resistance decreases as Vgs increases. The attenuation of the input signal (in dB) for the circuit shown in FIG. 6 is given by (2).

$$Atten(dB) = 20 * \log\left(\frac{R_{ds}}{R_{ds} + R}\right) \quad (2)$$

Where R is R1 in FIG. 6. This equation can be simplified and rewritten as shown by (3).

$$Atten(dB) = 20 * \log\left(\frac{1}{1 + RK(V_{gs} - V_T)}\right) \text{ where } K = \frac{\mu C_{ox} W}{L} \quad (3)$$

If (3) is differentiated with respect to Vgs, the result is shown in (4).

$$\frac{\partial Atten(dB)}{\partial V_{gs}} = -\frac{20RK\log e}{1 + RK(V_{gs} - V_T)} \quad (4)$$

If the source is grounded and the gate is supplied with the control voltage from the control terminal, as is the case in the arrangement of FIG. 6, (4) shows that for a control voltage just above $V_T$, the slope of the attenuation versus control voltage curve is approximately −20RKloge. As the control voltage rises, the slope decreases towards zero. This decrease in attenuation slope magnitude limits the attenuation range.

For a single MOSFET attenuator, a tradeoff exists between the attenuation slope and the attenuation range. By increasing the size (W/L ratio) of the MOSFET, the difference in MOSFET resistance when the MOSFET is on and when the MOSFET is off increases. Accordingly, the input signal can be attenuated many orders of magnitude between the on and off states of the MOSFET. As a result, the sensitivity of the attenuation control correspondingly increases. In other words, for very small changes in the gate voltage, there will be a large change in the attenuation of the input signal. On the other hand, by decreasing the size of the MOSFET, the difference in MOSFET resistance when the MOSFET is on and when the MOSFET is off decreases. Accordingly, the input signal can be attenuated by a comparatively smaller amount. This correspondingly decreases the sensitivity of the attenuation control so that for large changes in the gate voltage, only a relatively small change in the attenuation of the input signal occurs.

Thus, if only a single MOSFET is used as arranged in FIG. 6, a fixed attenuation range is obtained given a particular attenuation slope. One limitation as to the applications in which the variable attenuator may be used is the linearity of the attenuation curve in dB/V. The bandwidth of the AGC loop can be increased with increasing linearity of the attenuation slope. As discussed above, this may be of more importance in mobile applications, where the received signal strength can vary quickly over time. However, the linearity of the variable attenuator is also degraded by the presence of the shunt MOSFET. When the control voltage is near the threshold voltage of the MOSFET, the MOSFET is in the saturation region (in which $V_{gs} > V_t$ and $V_{ds} > V_{gs} - V_t$, where $V_{ds}$ is the drain-to-source voltage) and exhibits non-linear behavior. As the voltage increases, the gate-to-source voltage of the MOSFET increases until the MOSFET enters the linear region (in which $V_{gs} > V_t$ and $V_{ds} < V_{gs} - V_t$). If an increased attenuation range is desired, a device of increased size is used. However, as the MOSFET size increases, the linearity of the variable attenuator decreases when the control voltage is near the threshold voltage.

In more detail, FIG. 5 illustrates one embodiment of the variable attenuator. As shown, the variable attenuator 500 contains a pair of series resistors R1 and R2 connected between the input IN and the output OUT of the variable attenuator 500. A resistor chain R3, R4, R5, R6 is connected between the control voltage and ground Vss. The resistors R3, R4, R5, R6 act as voltage dividers between the control voltage and ground Vss. The nodes between the adjacent resistors in the resistor chain R3, R4, R5, R6 are connected to control terminals of the devices M1, M2, M3. Thus, each node between adjacent resistors R3, R4, R5, R6 provides a predetermined voltage that is dependent on the control voltage (more specifically, a ratio of the difference between the control voltage and Vss) to the terminals of the devices M1, M2, M3. The resistors in the resistor chain R3, R4, R5, R6, similar to the resistors R1, R2 between the input IN and the output OUT, may have any desired resistance. For example, the resistance of resistor R2 may be 0.

As described above, the MOSFETs M1, M2, M3 act as shunts for signals passing between the input IN and the output OUT of the variable attenuator 500, with the gates of the MOSFETs M1, M2, M3 connected to the nodes between the adjacent resistors in the resistor chain R3, R4, R5, R6. Either n-channel or p-channel MOSFETs may be used, although n-channel MOSFETs may be more desirable at least as a smaller device can be used to achieve the same drain-to-source resistance. The MOSFETs M1, M2, M3 are connected in parallel between the series resistors R1, R2.

The MOSFETs M1, M2, M3 are controlled by the voltage at the associated nodes of the resistor chain R3, R4, R5, R6. This voltage may be a continuous analog voltage or a discrete digital voltage. As described above, as the control voltage increases, the drain-to-source resistance of each MOSFET decreases from a relatively high resistance when the MOSFET is off continuously until it reaches a predetermined low resistance when the MOSFET is on. Thus, the input signal is attenuated by a voltage divider created by the series resistor pair R1, R2 and the MOSFETs M1, M2, M3. As the gates of the MOSFETs M1, M2, M3 are supplied with different voltages, which are all dependent on the control voltage, the MOSFETs M1, M2, M3 turn on at different times. In other words, the MOSFETs M1, M2, M3 turn on at different voltage levels of the control voltage.

In one embodiment, the MOSFETs M1, M2, M3 have different sizes. In some embodiments, although each of the channel lengths is the same, each of the channel widths of the MOSFETs M1, M2, M3 is W, 8 W, and 32 W, respectively. By varying the sizes of the MOSFETs M1, M2, M3 and turning on the MOSFETs M1, M2, M3 at different voltage levels of the control voltage, a better tradeoff between attenuation range and attenuation slope can be obtained. As shown in FIG. 5, the larger the MOSFET, i.e. the larger the width, the smaller the voltage applied to the control terminal and thus the larger the control voltage to turn on the MOSFET. This arrangement permits the MOSFETs M1, M2, M3 to compensate for non-linearity. More specifically, the smaller MOSFETs remain in the linear region when the larger MOSFETs are in the saturation region. As the larger MOSFETs have smaller resistances than the smaller MOSFETs, and since the source/drain of the MOSFETs are connected in parallel, the effect of the saturation of the larger MOSFETs on the attenuation curve is decreased in significance by the smaller MOSFETs. This accordingly permits the attenuation to increase substantially linearly at higher control voltage levels. Thus, as the control voltage is related to the voltage from the tuner, as the voltage from the tuner increases, the amount of attenuation increases.

The operation of the variable attenuator 500 will be described. When operating, an input signal is supplied to the input IN. If the control voltage is 0 volts, the output voltage Vout is equal to the input voltage Vin. As the control voltage rises, MOSFET M1 will turn on first. The slope of the attenuation versus control voltage curve starts to increase to a maximum value determined essentially by the voltage divider of resistor R1 and the resistance of MOSFET M1. Eventually, the slope magnitude starts to decrease, as shown in equation (4), at which point MOSFET M2 starts to turn on. Thus, the attenuation slope stays substantially constant until the slope magnitude of the attenuation due to MOSFET M2 starts to decrease. At this point, it is desired to have MOSFET M3 start to turn on, etc.

Figure 7:
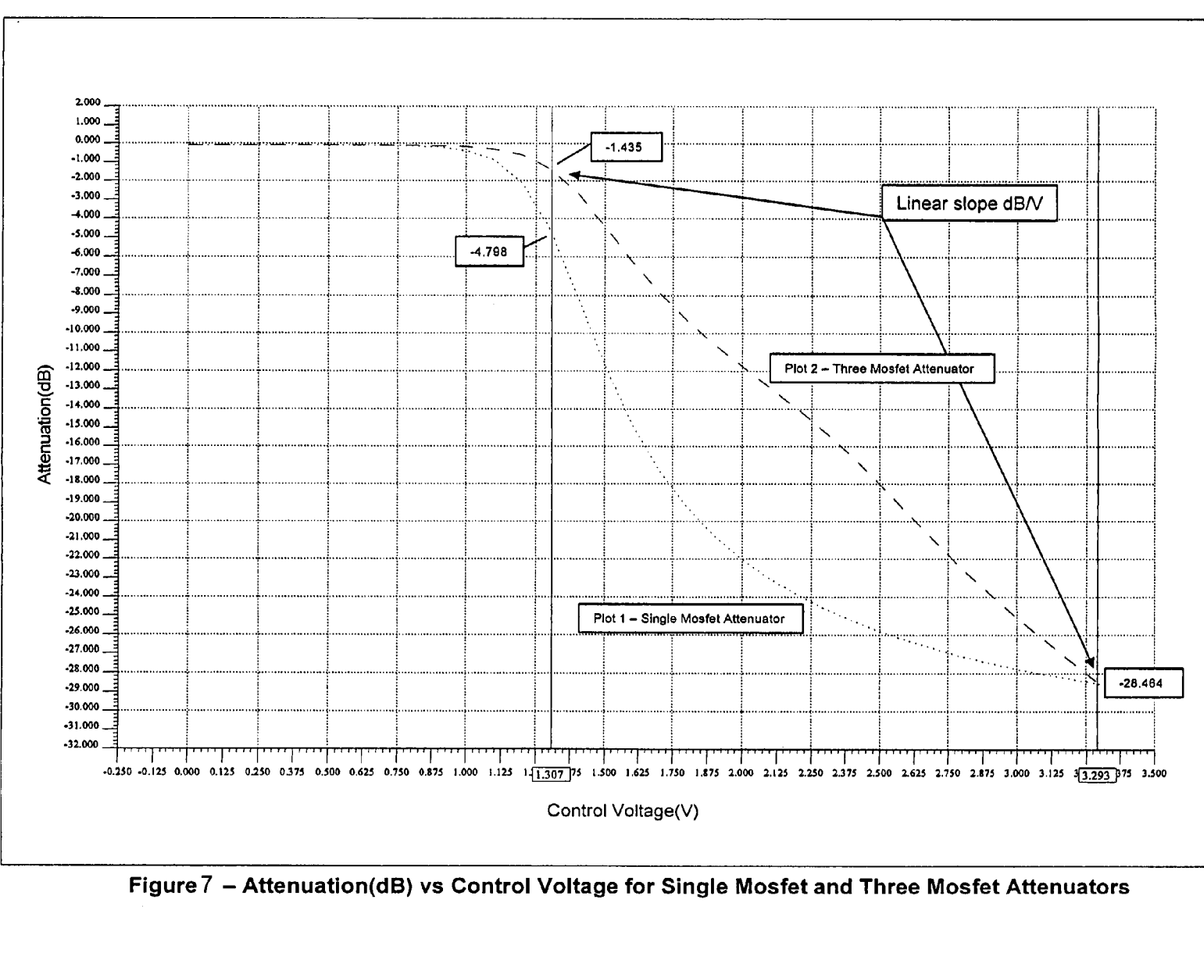
FIG. 7 is a plot of attenuation vs. control voltage for a single MOSFET variable attenuator and three MOSFET variable attenuator in accordance with the attenuator of FIG. 5.

The slope of the plot of the three MOSFET attenuator is shown in FIG. 7. This slope is substantially constant over a much broader range of control voltages compared to the single MOSFET variable attenuator. With judicious choice of the MOSFET size and resistor selection for both the resistor chain and the resistor R1 connected to the input of the variable attenuator, a particular constant attenuation slope can be achieved for many orders of magnitude of the attenuation. Thus, a desired attenuation range and sensitivity to the control voltage can be achieved simultaneously. The control voltage extends to a maximum of 3.3V. In the plot, a three MOSFET variable attenuator with different MOSFET sizes (M3>M2>M1) was designed to give the same attenuation range as a single MOSFET variable attenuator. The three MOSFET variable attenuator was also designed to have an attenuation curve slope of −14 dB/V. As can be seen, the single MOSFET variable attenuator is only dB/V linear for a small range of the control voltage, from about 1.3V to about 1.6V. The three MOSFET variable attenuator is dB/V linear with an approximate slope of −14 dB/V for a much larger control voltage range, from about 1.3V to about 3.3V. This more linear in dB/V attenuation slope allows for a larger bandwidth AGC loop. This enables the variable attenuator to be used in a mobile application where the received signal strength can vary quickly over time.

In addition, the intermodulation (IM) distortion products produced by the multiple MOSFET variable attenuator is significantly less than that of the single MOSFET variable attenuator. Since the first device to turn on is the smallest, it does not have as negative of an effect on linearity as a larger device when the gate-to-source voltage is near threshold. As a larger MOSFET starts to turn on, the smaller MOSFET(s) is well into the linear region. Thus, the initial non-linearities associated with the drain-to-source resistance of the larger MOSFET is decreased due to the presence of the more linear drain-to-source resistance of the smaller MOSFET. In the plot of attenuation vs. gain, for a constant output power level of −25 dBm, the linearity of the variable attenuators was observed at attenuation levels from −1 dB to −25 dB with a −1 dB step. The worst intermodulation distortion over the entire attenuation range for a constant output power of −25 dBm was −56.2 dB for the single MOSFET variable attenuator and −69.25 dB for the three MOSFET variable attenuator. Thus, the three MOSFET variable attenuator has an improved intermodulation distortion level of +13 dB over the single MOSFET variable attenuator as well as a more constant attenuation slope over the same attenuation range.

Figure 8:
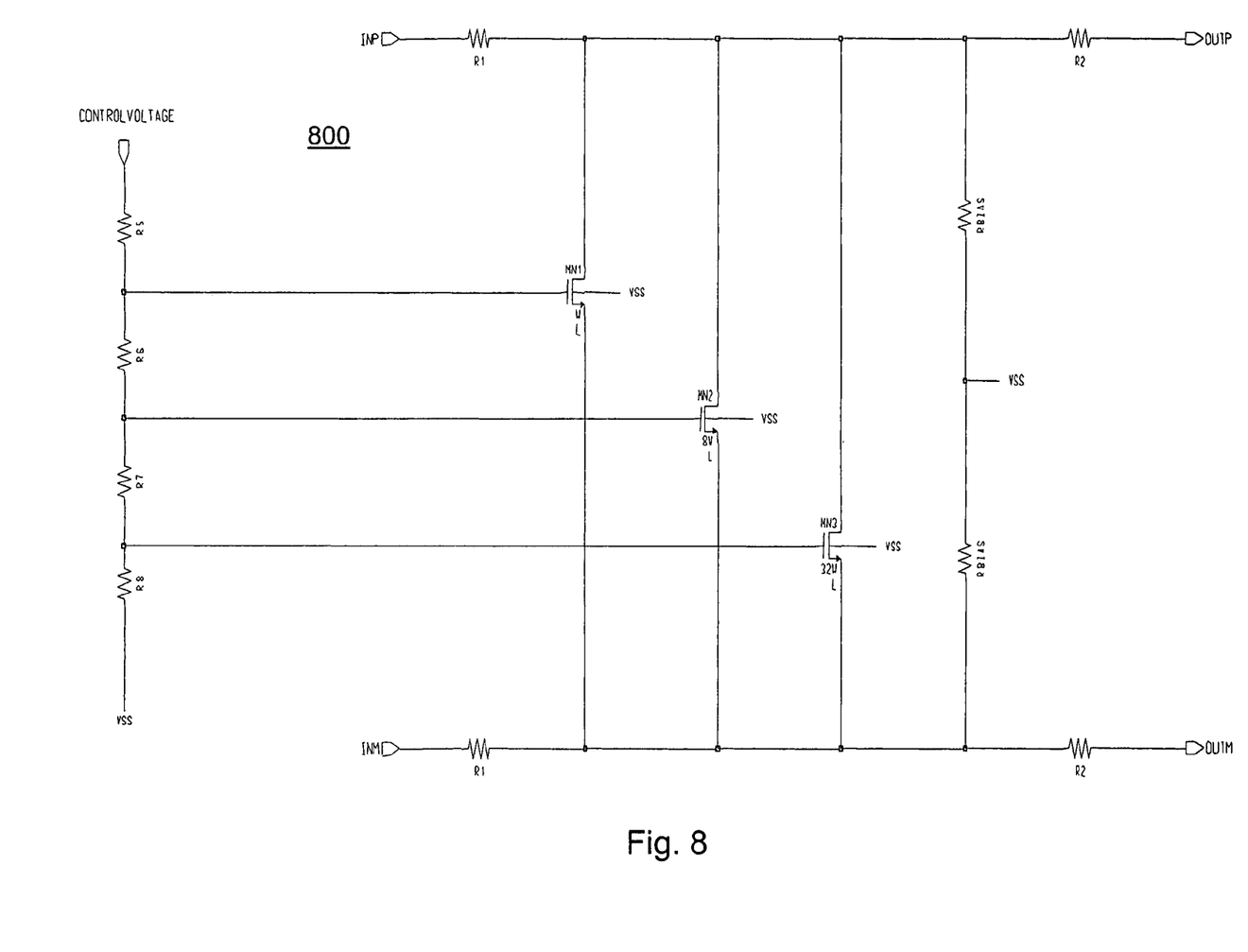
FIG. 8 illustrates another embodiment of the variable attenuator in accordance with an embodiment of the invention.

FIG. 8 illustrates another embodiment of the three MOSFET variable attenuator. As illustrated, the variable attenuator 800 is a differential variable attenuator containing a pair of series resistors R1 and R2 connected between each of the inputs INP, INM and the respective outputs OUTP, OUTM. A resistor chain R3, R4, R5, R6 is connected between the control voltage and ground Vss. The nodes between the adjacent resistors in the resistor chain R3, R4, R5, R6 are connected to gates of the respective MOSFETs M1, M2, M3. As before, the MOSFETs M1, M2, M3 have a channel width of W, 8 W, and 32 W, respectively. To balance the output signals, a pair of bias resistors RBIAS are connected in series with each other. The bias resistors RBIAS connected in parallel with the MOSFETs M1, M2, M3 are connected between the series resistors R1, R2. The node between the bias resistors RBIAS is connected to ground Vss.

Figure 9:
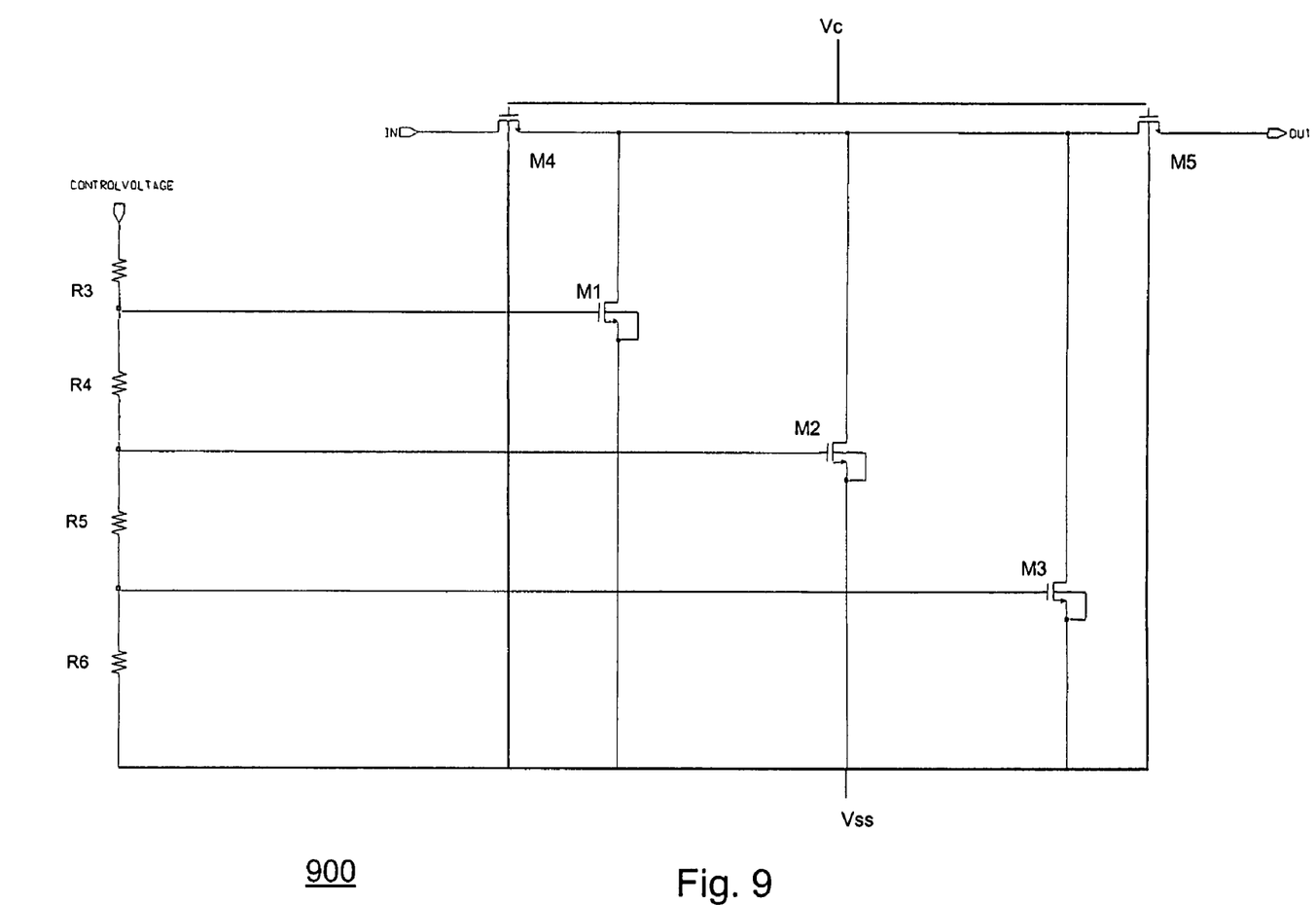
FIG. 9 illustrates another embodiment of the variable attenuator in accordance with an embodiment of the invention.

Although resistors have been described as the first element in FIG. 5, other devices may be used, as shown in the embodiment FIG. 9. The embodiment of FIG. 9 is identical to that of FIG. 5, except that the series resistors R1, R2 between the input IN and the output OUT of the variable attenuator have been replaced by MOSFETs M4, M5. The gates of the series MOSFETs M4, M5 are connected to a voltage Vc, and thus have a resistance dependent on the voltage Vc. The series MOSFETs M4, M5 have the same or different sizes and may have the same or different voltages applied to their gates. The voltage Vc may be constant or continuously or discretely variable.

Figure 10:
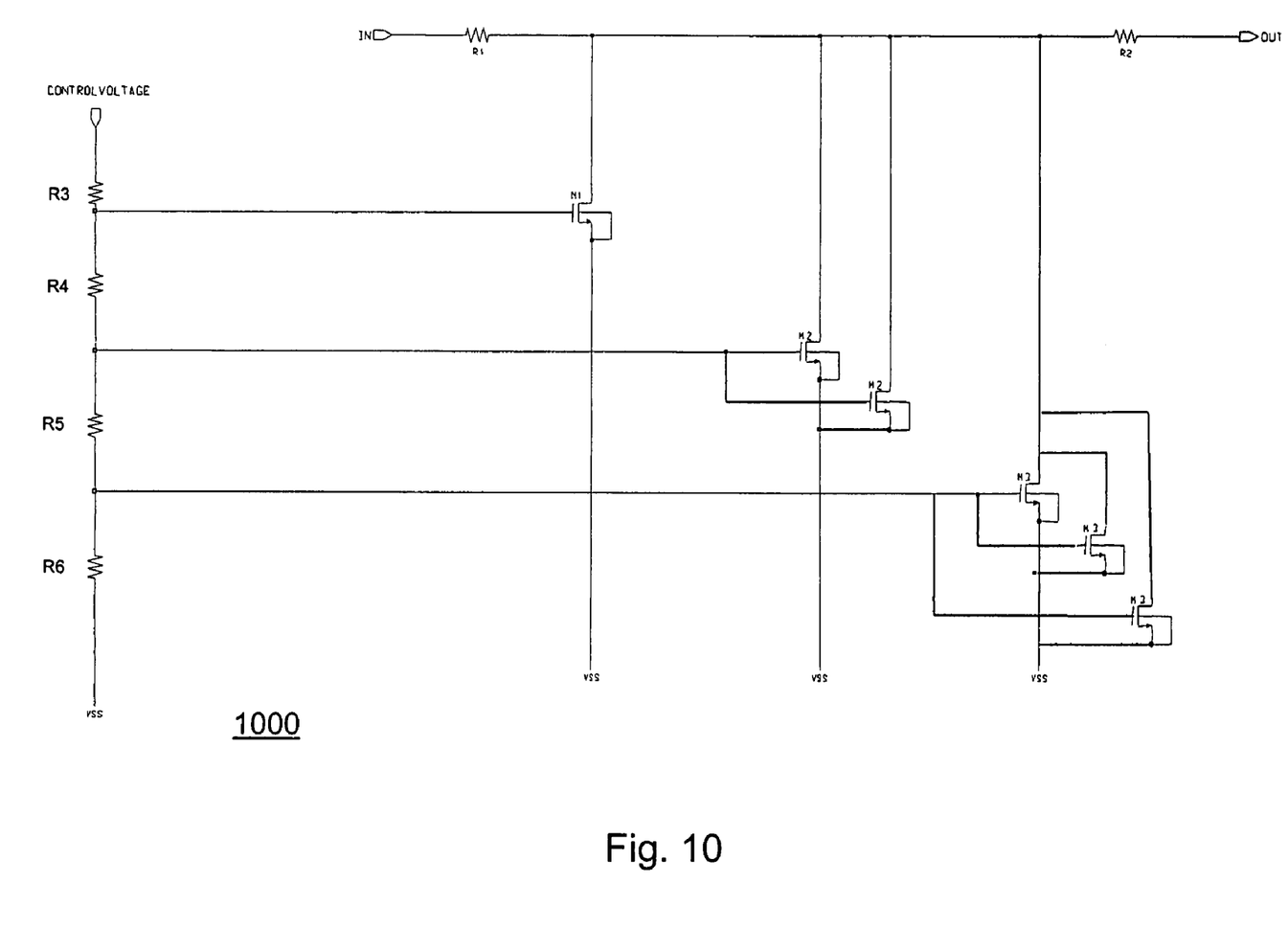
FIG. 10 illustrates another embodiment of the variable attenuator in accordance with an embodiment of the invention.

In other embodiments, any FET or other device(s) can be used, as long as it provides the desired attenuation characteristics. For example, MISFETs or variable resistors may be used rather than MOSFETs. By using CMOS, however, the current drain of the variable attenuator does not change substantially across the attenuation range. Similarly, although embodiments using three MOSFETs are shown, two or more MOSFETs can be used in different embodiments. Moreover, although the MOSFETs are described as having different sizes, and thus different drain-to-source resistances, two or more of the MOSFETs can have the same size while being connected to different nodes of the resistor chain or multiple MOSFETs can be connected to the same node. Thus, for example, one or more of the MOSFETs shown in the figures can be implemented by multiple MOSFETs, as shown in the variable attenuator 1000 shown in FIG. 10. In one embodiment, the multiple MOSFETs have the same channel width to provide an effective channel width. In another embodiment, at least one of the multiple MOSFETs has a different channel width than another of the multiple MOSFETs.

Similarly, MOSFETs of various lengths can be used. However, as the length of the MOSFET increases, so does the minimum resistance. In addition, any number of resistors can be used. Other elements such as resistors may be connected in series with the MOSFETs, for example. A resistor that is much larger than the source-to-drain resistance may be disposed between the source and drain of the MOSFET. The amplifier may be used in devices other than tuners, for instance, cable modems, radios, cellular telephones, PDAs, laptop computers or other communication devices or systems that use an amplifier.

Accordingly, an amplifier for a tuner or other electronic device is provided. The amplifier contains a fixed gain stage, a digitally controlled gain stage and a linear, analog controlled variable attenuator between the fixed and controllable gain stages. The amplifier has an improved noise performance over an extended gain control range while providing a constant output power level.

Accordingly, the specification and figures are to be regarded in an illustrative rather than a restrictive sense, and all such modifications are intended to be included within the scope of present invention. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Similarly, the term "a" or "an" is intended to cover one or more elements succeeding the term.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. An amplifier comprising:
   a variable attenuator having an input to receive an input signal to be attenuated, an output to supply an attenuated output signal, and a control terminal to receive a control signal from an automatic gain controller, wherein attenuation of the variable attenuator is dependent on the control signal; and
   a first gain stage having a controllable gain, an input of the first gain stage connected with the output of the attenuator, wherein the gain of the first gain stage is controlled by a first gain stage controller.

2. The amplifier of claim 1, further comprising a second gain stage having a fixed gain, the second gain stage having an output connected with the input of the attenuator.

3. The amplifier of claim 1, wherein the attenuator is analog controllable such that the attenuation of the attenuator is continuously variable and the first gain stage is digitally controllable such that the gain of the first gain stage is controllable in discrete steps.

4. The amplifier of claim 1, wherein the attenuator comprises:
   a first element disposed between the input of the attenuator and the output of the attenuator;
   a control terminal configured to receive a control signal; and a plurality of second elements connected to the control terminal such that each of the second elements changes attenuation between the input and the output differently with the control signal.

5. The amplifier of claim 4, wherein each second element comprises a field effect transistor (FET), the attenuator further comprising a plurality of resistors in series between the control terminal and ground, control inputs of the FETs connected to nodes between different adjacent resistors.

6. The amplifier of claim 5, wherein the FETs have different sizes, a smaller of the FETs is connected to the control terminal through a smaller resistance than a larger of the FETs.

7. The amplifier of claim 4, wherein the first element and the second elements form a voltage divider having an output node connected to the output of the variable attenuator.

8. An electronic apparatus comprising:
a variable attenuator having an input operable to receive an input signal to be attenuated, an output operable to supply an attenuated output signal, and a control terminal operable to receive a control signal such that attenuation of the attenuator is dependent on the control signal;
a first gain stage having a controllable gain, the first gain stage having an output and an input connected with the output of the attenuator; and
a control circuit connected with the output of the first gain stage and the control terminal of the attenuator, the control circuit operable to provide the control signal to the control terminal of the attenuator, the control circuit additionally connected with the first gain stage and operable to control the gain of the first gain stage, wherein the control circuit comprises:
an automatic gain controller operable to provide the control signal to the control terminal of the attenuator; and
a first gain stage controller operable to control the gain of the first gain stage.

9. The electronic apparatus of claim 8, wherein:
the automatic gain controller is connected with the output of the first gain stage and the control terminal of the attenuator; and
the first gain stage controller is connected with the first gain stage.

10. The electronic apparatus of claim 9, wherein the attenuator is analog controllable such that the attenuation of the attenuator is continuously variable and the first gain stage is digitally controllable such that the gain of the first gain stage is controllable in discrete steps.

11. The electronic apparatus of claim 9, further comprising a second gain stage having a fixed gain, the second gain stage having an output connected with the input of the attenuator.

12. The electronic apparatus of claim 11, further comprising a mixer having an input to receive an input signal to be down-converted and an output connected with the input of the second gain stage such that the down-converted signals are supplied to the second gain stage.

13. The electronic apparatus of claim 12, further comprising:
a low noise amplifier disposed between an input of the electronic apparatus and the mixer; and
a second amplifier disposed between the mixer and the attenuator.

14. The electronic apparatus of claim 9, wherein the attenuator comprises a plurality of parallel elements and a first voltage divider that is connected to the control terminal, the parallel elements connected to different nodes of the first voltage divider.

15. The electronic apparatus of claim 14, wherein the variable attenuator further comprises a second voltage divider containing a series circuit that includes a resistor and the parallel elements, a node between the resistor and the parallel elements connected to an output of the variable attenuator.

16. The electronic apparatus of claim 15, wherein the parallel elements vary over different ranges of resistance and a parallel element that varies over a smaller range of resistance is connected to the control terminal through a smaller resistance than a parallel element that varies over a larger range of resistance.

17. A method of amplifying a signal in an amplifier comprising a variable attenuator and a controllable gain stage, the method comprising:
receiving a signal to be attenuated;
controlling attenuation of the attenuator with an output of an automatic gain controller, the attenuation dependent on an output level of an output of the amplifier;
attenuating the signal to provide an attenuated signal;
controlling gain of the controllable gain stage with a controller; and
amplifying the attenuated signal using the controllable gain stage to provide a first amplified signal.

18. The method of claim 17, further comprising controlling the attenuation of the attenuator and the gain of the controllable gain stage such that the output power level of the amplifier remains constant.

19. The method of claim 18, wherein controlling the attenuation of the attenuator and the gain of the controllable gain stage comprises:
supplying an output of the amplifier to the automatic gain controller;
supplying the output of the automatic gain controller to the attenuator to control the attenuation of the attenuator; and
supplying at least one of the output of the amplifier, the output of the automatic gain controller, or the attenuated signal to the controller to control the controllable gain stage.

20. The method of claim 17, further comprising controlling the attenuation of the attenuator and the gain of the controllable gain stage such that a noise figure of the amplifier does not exceed a predetermined amount over a predetermined range of gain of the amplifier.

21. The method of claim 20, further comprising decreasing the gain of the controllable gain stage when the attenuation of the attenuator reaches a predetermined maximum value and reducing the attenuation of the attenuator thereafter.

22. The method of claim 17, further comprising controlling the attenuation of the attenuator using an analog signal such that the attenuation of the attenuator is continuously variable and controlling the gain of the first gain stage using a digital signal such that the gain of the controllable gain stage is variable in discrete steps.

23. The method of claim 17, wherein the amplifier further comprises a fixed gain stage, the method further comprising:
receiving an input signal to be amplified;
amplifying the input signal using the fixed gain stage to provide a second amplified signal; and
supplying the second amplified signal to the attenuator as the signal to be attenuated.

* * * * *